(12) United States Patent
Schäfer et al.

(10) Patent No.: US 8,925,789 B2
(45) Date of Patent: Jan. 6, 2015

(54) CONTACTING MEANS AND METHOD FOR CONTACTING ELECTRICAL COMPONENTS

(75) Inventors: Michael Schäfer, Künzell (DE); Wolfgang Schmitt, Rodgau (DE)

(73) Assignee: Heraeus Materials Technology GmbH & Co. KG, Hanau (DE)

( * ) Notice: Subject to any disclaimer, the term of this patent is extended or adjusted under 35 U.S.C. 154(b) by 12 days.

(21) Appl. No.: 13/224,514

(22) Filed: Sep. 2, 2011

(65) Prior Publication Data

US 2012/0055978 A1     Mar. 8, 2012

(30) Foreign Application Priority Data

Sep. 3, 2010   (DE) .................. 10 2010 044 329

(51) Int. Cl.

| | |
|---|---|
| B23K 35/22 | (2006.01) |
| B22F 1/00 | (2006.01) |
| B22F 1/02 | (2006.01) |
| B22F 7/06 | (2006.01) |
| B22F 7/08 | (2006.01) |
| H01L 23/00 | (2006.01) |

(52) U.S. Cl.
CPC ............. *B22F 1/0062* (2013.01); *B22F 1/007* (2013.01); *B22F 1/0074* (2013.01); *B22F 1/02* (2013.01); *B22F 7/064* (2013.01); *B22F 7/08* (2013.01); *H01L 24/83* (2013.01); *H01L 24/27* (2013.01); *H01L 24/29* (2013.01); *H01L 2224/8384* (2013.01); *H01L 2924/01004* (2013.01); *H01L 2924/01012* (2013.01);*H01L 2924/01013* (2013.01); *H01L 2924/01025* (2013.01); *H01L 2924/01029* (2013.01); *H01L 2924/01032* (2013.01); *H01L 2924/01038* (2013.01); *H01L 2924/01047* (2013.01); *H01L 2924/01051* (2013.01); *H01L 2924/01056* (2013.01); *H01L 2924/01073* (2013.01); *H01L 2924/01079* (2013.01); *H01L 2924/01082* (2013.01); *H01L 2924/09701* (2013.01); *H01L 2224/2949* (2013.01); *H01L 2224/271* (2013.01); *H01L 2224/29324* (2013.01); *H01L 2224/2939* (2013.01); *H01L 2224/29455* (2013.01); *H01L 2224/29439* (2013.01); *H01L 2224/29447* (2013.01); *H01L 2224/83469* (2013.01); *H01L 24/05* (2013.01); *H01L 24/32* (2013.01); *H01L 2224/04026* (2013.01); *H01L 2224/05639* (2013.01); *H01L 2224/05644* (2013.01); *H01L 2224/05647* (2013.01); *H01L 2224/05664* (2013.01); *H01L 2224/05669* (2013.01); *H01L 2224/27436* (2013.01); *H01L 2224/27505* (2013.01); *H01L 2224/29339* (2013.01); *H01L 2224/29347* (2013.01); *H01L 2224/29355* (2013.01); *H01L 2224/29369* (2013.01); *H01L 2224/29387* (2013.01); *H01L 2224/32225* (2013.01); *H01L 2224/32245* (2013.01); *H01L 2224/83192* (2013.01); *H01L 2224/83203* (2013.01); *H01L 2224/83439* (2013.01); *H01L 2224/83444* (2013.01); *H01L 2224/83447* (2013.01); *H01L 2224/83464* (2013.01); *H01L 2924/01005* (2013.01); *H01L 2924/01006* (2013.01); *H01L 2924/01019* (2013.01);*H01L 2924/0102* (2013.01); *H01L 2924/01023* (2013.01); *H01L 2924/01033* (2013.01); *H01L 2924/01042* (2013.01); *H01L 2924/01044* (2013.01); *H01L 2924/0105* (2013.01); *H01L 2924/01074* (2013.01); *H01L 2924/01076* (2013.01); *H01L 2924/01078* (2013.01); *H01L 2224/27003* (2013.01); *H01L 2224/29444* (2013.01);

(Continued)

(58) Field of Classification Search
USPC .......... 228/56.3, 179.1, 193, 256; 148/23, 24; 75/252, 255
See application file for complete search history.

(56) References Cited

U.S. PATENT DOCUMENTS

| | | | |
|---|---|---|---|
| 4,810,672 A | 3/1989 | Schwarzbauer | |
| 6,951,666 B2 * | 10/2005 | Kodas et al. | ............... 427/376.6 |
| 7,766,218 B2 | 8/2010 | Yamakawa et al. | |
| 2005/0194577 A1 * | 9/2005 | Kasuga et al. | ................ 252/514 |
| 2005/0247760 A1 * | 11/2005 | Palm | ........................... 228/193 |
| 2007/0178232 A1 | 8/2007 | Kodas et al. | |

(Continued)

FOREIGN PATENT DOCUMENTS

| | | |
|---|---|---|
| DE | 3414065 A1 | 12/1985 |
| DE | 102004019567 B3 | 1/2006 |
| DE | 102007046901 A1 | 4/2009 |
| EP | 0242626 B1 | 6/1991 |
| JP | 11012551 A * | 1/1999 |

(Continued)

OTHER PUBLICATIONS

Office Action issued Jun. 6, 2011 in DE Application No. 10 2010 044 329.8.

*Primary Examiner* — Devang R Patel
(74) *Attorney, Agent, or Firm* — Panitch Schwarze Belisario & Nadel LLP

(57) ABSTRACT

A method is provided for connecting at least two components, in which a sintering preform is used. This preform includes a carrier having a surface that has at least one structuring element containing hardened paste, wherein the hardened paste contains: (a) metal particles having a coating that contains at least one organic compound; and (b) at least one sintering aid selected from the group consisting of (b1) organic peroxides, (b2) inorganic peroxides, (b3) inorganic acids, (b4) salts of organic acids, wherein the organic acids have 1-4 carbon atoms, (b5) esters of organic acids, wherein the organic acids have 1-4 carbon atoms, and (b6) carbonyl complexes. The surface of the carrier having the hardened paste is not reactive to the constituents of the paste.

13 Claims, No Drawings

(52) U.S. Cl.
CPC ............... *H01L 2224/29294* (2013.01); *H01L 2224/29424* (2013.01); *H01L 2224/29469* (2013.01); *H01L 2224/29464* (2013.01); *H01L 2224/29295* (2013.01); *H01L 2224/27442* (2013.01); *H01L 2224/48247* (2013.01); *H01L 2224/73265* (2013.01); *H01L 2924/0132* (2013.01); *H01L 2924/0133* (2013.01); *H01L 2924/01327* (2013.01); *H01L 2924/13055* (2013.01); *H01L 2924/10253* (2013.01); *H01L 2224/05571* (2013.01); *H01L 2924/07811* (2013.01)
USPC ....... 228/56.3; 228/179.1; 228/245; 228/256; 148/23; 148/24; 75/252; 75/255

(56) References Cited

U.S. PATENT DOCUMENTS

| | | | |
|---|---|---|---|
| 2009/0152331 A1* | 6/2009 | Schmitt et al. | 228/256 |
| 2010/0175806 A1* | 7/2010 | Shiraishi et al. | 156/60 |
| 2012/0003465 A1* | 1/2012 | Rittner et al. | 428/323 |
| 2012/0085976 A1* | 4/2012 | Kuo et al. | 252/512 |

FOREIGN PATENT DOCUMENTS

| | | | |
|---|---|---|---|
| JP | 11092736 A | * | 4/1999 |
| JP | 2010176894 A | * | 8/2010 |
| WO | WO 2008037559 A1 | * | 4/2008 |

\* cited by examiner

CONTACTING MEANS AND METHOD FOR CONTACTING ELECTRICAL COMPONENTS

BACKGROUND OF THE INVENTION

The present invention relates to sintering preforms and to a method for connecting at least two components in which these sintering preforms are used.

In the field of power electronics, the connecting of at least two components that have high sensitivity to pressure and temperature, for example substrates having electronic components such as LEDs or very thin silicon chips, presents a particular challenge.

For this reason, substrates having such pressure- and temperature-sensitive components are often connected by gluing. Suitable conductive glues customarily contain silver particles, thermosetting polymers, and reactive thinners. However, the gluing technology has the disadvantage that it creates contact points between the substrate and the component that have insufficient heat conductivity or electrical conductivity.

In order to solve this problem, it has been proposed to connect components to substrates by sintering.

These sintering methods customarily use pastes consisting of the metal powder to be sintered and a solvent.

For this purpose, German Patent DE 34 14 065 C2 proposes (i) the application of such a paste onto the surface of an electronic component or substrate to be connected, (ii) application of the component onto the substrate, wherein the paste is situated between the component and the substrate, (iii) expelling the solvent from the composite created in this way, and (iv) sintering the composite.

This sintering method achieves the reliable connection of the electronic component to the substrate. However, it has turned out to be disadvantageous that the solvent is not expelled until after the composite of the electronic component and the substrate has already been created. Because in this composite the paste containing the solvent already stands in contact with the surfaces of the electronic component and of the substrate to be connected, a simple and rapid degassing is no longer possible, so that the composite has to be dried for a longer period of time.

In order to solve this problem, according to European Patent EP 0 242 626 B1 the paste is applied onto the surface of the electronic component or of the substrate to be connected and is dried immediately thereafter. Only after the drying is the component placed onto the substrate, wherein the dried paste is situated between the electronic component and the substrate. Thereafter, the composite created in this way is sintered.

A further development of this method is known from German Patent DE 10 2004 019 567 B3. That document proposes that a paste be applied as a layer onto a carrier foil and dried. Thereafter, one or more components are placed onto the layer of dried paste. Pressure is thereafter applied to the composite made up of the component, the layer of dried paste, and the carrier foil, in order to increase the adhesive force between the dried paste and the component so that the dried paste adheres to the component and can thus be lifted off from the carrier foil. The component with the dried paste can thereafter be positioned on the substrate, and the composite made up of the substrate, component, and the layer of dried paste situated between them can be sintered.

From an economic point of view, this method has turned out to be advantageous, because it enables a rational and at least partly parallel processing of a plurality of components, as well as a structured design of the sintering layer.

However, here it is disadvantageous that this sintering method, like other conventional sintering methods, requires either a high process pressure (for example greater than 30 MPa) or else a high process temperature (greater than 250° C.). These conditions often cause damage to the components to be connected, so that conventional sintering methods must be ruled out for many applications.

German published patent application DE 10 2007 046 901 A1 proposes a sintering technique that succeeds in creating connecting layers for use in power electronics, having very good electrical and thermal conductivity. In this sintering method, a metal paste is used that contains, in addition to an alcoholic solvent, a silver compound that decomposes to form elemental silver at 300° C. These metal pastes enable a reduction of the process pressure to less than 3 bars and a reduction of the process temperature to less than 250° C. This sintering technique represents a large leap in quality in the connection of substrates having pressure- and temperature-sensitive components.

However, for many applications it would be desirable to further lower the process temperature. This would place a lower load on the components to be connected, and would thus provide a further increase in quality of components in the area of power electronics. In addition, a further lowering of the process temperature would create significant savings in energy costs.

BRIEF SUMMARY OF THE INVENTION

Therefore, an object of the present invention is to provide a method for connecting at least two components that enables a processing of a plurality of components in a way that is advantageous with regard to process economics and is at least partly parallel, while also enabling a structured design of the sintering layer and a lowering of the sintering temperature to below 250° C.

This object is achieved by a method for connecting at least two components in which:

(i) a sintering preform is provided comprising a carrier having a surface having at least one structuring element that contains hardened paste, the hardened paste containing (a) metal particles having a coating containing at least one organic compound, and (b) at least one sintering aid selected from the group consisting of (b1) organic peroxides, (b2) inorganic peroxides, (b3) inorganic acids, (b4) salts of organic acids, wherein the organic acids have 1-4 carbon atoms, (b5) esters of organic acids, wherein the organic acids have 1-4 carbon atoms, and (b6) carbonyl complexes, the surface of the carrier having the hardened paste not being reactive with the constituents of the paste;

(ii) at least one first component having a surface to be connected and a second component having a surface to be connected are provided;

(iii) at least one structuring element on the surface of the carrier of the sintering preform is contacted with the surface of the first component to be connected, in order to create an arrangement made up of the first component and the at least one structuring element, which stands in contact with the carrier;

(iv) the arrangement made up of the first component and the at least one structuring element is removed from the carrier;

(v) the surface of the second component to be connected is contacted with the at least one structuring element of the arrangement made up of the first component and the at least one structuring element, in order to create a sintering arrangement made up of the first component, the second component, and the structuring element situated between them; and (vi) the sintering arrangement is sintered.

In this method, a sintering preform is used comprising a carrier having a surface which has at least one structuring element that contains hardened paste, wherein the hardened paste:

(a) contains metal particles having a coating that contains at least one organic compound, and (b) contains at least one sintering aid selected from the group consisting of (b1) organic peroxides, (b2) inorganic peroxides, (b3) inorganic acids, (b4) salts of organic acids, wherein the organic acids have 1-4 carbon atoms, (b5) esters of organic acids, wherein the organic acids have 1-4 carbon atoms, and (b6) carbonyl complexes, and wherein the surface of the carrier having the hardened paste is not reactive with the constituents of the paste.

DETAILED DESCRIPTION OF THE INVENTION

In the method according to the present invention, at least two components are connected to one another. Preferably, a plurality of components are fastened next to one another on another component, for example in a plane.

The term "component" is not further limited. In the broadest sense, it is to be understood as referring to objects that can be connected to one another. According to a preferred embodiment, one of the components to be connected is an electronic component, and the other component to be connected is a substrate.

According to a particularly preferred embodiment, the method according to the present invention, using the sintering preform according to the present invention, fastens a plurality of electronic components next to one another on a substrate, for example in a plane.

The term "electronic component" is to be understood as referring generally to an object, which can be a part of an electronic arrangement. According to a preferred embodiment, this is understood as being an individual part that cannot be further disassembled and that can act as a component of an electronic circuit. The electronic component can as a unit optionally comprise a plurality of constructive parts. The electronic component can, for example, be an active component or a passive component. According to particular embodiments, the electronic components are used in high-power electronics. According to a preferred embodiment, the electronic component is selected from the group consisting of diodes (for example LEDs, light-emitting diodes), transistors (for example IGBTs, insulated-gate bipolar transistors, bipolar transistors having insulated gate-electrode), integrated circuits, semiconductor chips, bare dies, resistors, sensors, capacitors, coils, and cooling elements.

The term "substrate" is generally understood as an object connectable to an electronic component. According to a preferred embodiment, the substrate is selected from the group consisting of leadframes, DCB (direct copper bonded) substrates, and ceramic substrates.

According to a preferred embodiment, the following pairs of electronic component and substrate are connected to one another: LED/leadframe, LED/ceramic substrate, die/leadframe, die/ceramic substrate, die/DCB substrate, diode/leadframe, diode/ceramic substrate, diode/DCB substrate, IGBT/leadframe, IGBT/ceramic substrate, IGBT/DCB substrate, integrated circuit/leadframe, integrated circuit/ceramic substrate, integrated circuit/DCB substrate, sensor/leadframe, sensor/ceramic substrate, cooling element (preferably copper or aluminum cooling element)/DCB, cooling element (preferably copper or aluminum cooling element)/ceramic substrate, cooling element/leadframe, capacitor (preferably tantalum capacitor, more preferably in the unhoused state)/leadframe.

The components to be connected can each comprise at least one metallization layer. This metallization layer can have, for example, pure metal or a metal alloy. If the metallization layer has a metal, this is preferably selected from the group consisting of copper, silver, gold, palladium, and platinum. If the metallization layer has a metal alloy, this preferably contains at least one metal selected from the group consisting of silver, gold, nickel, palladium, and platinum. The metallization layer can also have a multilayer construction. According to a further preferred embodiment, the metallization layer also contains a glass.

According to the present invention, the connection of at least two components is understood as the fastening of a first component on a second component. In this context, "on" means only that a surface of the first component is connected to a surface of the second component, wherein the relative position of the two components or of the arrangement containing the at least two components is not important.

For the method according to the present invention, a sintering preform according to the present invention is first provided.

A "sintering preform" is to be understood in the broadest sense as an arrangement with whose aid a paste used in the sintering method of the present invention can easily be applied onto the surfaces of two components.

This sintering preform comprises a carrier having a surface, which has at least one structuring element containing hardened paste.

The carrier has a surface made of a material that is not reactive, in particular is chemically inert, with the constituents of the paste or with the paste itself.

In the context of the present invention, the material of the carrier surface is not reactive, if it is not sinterable. The material of the carrier surface is not sinterable if it is such that no diffusion processes take place between the material of the carrier surface and the metal particles contained in the paste. Correspondingly, it is preferable that at a temperature of 25° C. and a pressure of 1013 hPa no interactions take place between the material of the carrier surface and the components of the paste, which would make the carrier unusable for accepting the paste and would make the paste unusable for a sintering process. In addition, the carrier surface should be made of a material that permits easy detaching of the hardened paste from the carrier.

According to a preferred embodiment, the material of the carrier surface is such that diffusion no interactions predominate between the material of the carrier surface and the metal particles contained in the paste; rather, adhesion interactions predominate between the material of the carrier surface and the hardened paste.

The fact that the material of the carrier surface is not reactive with the constituents of the paste or with the paste itself ensures that when the method according to the present invention is carried out, an arrangement of a first component and the at least one structuring element is easily detachable from the carrier.

According to a preferred embodiment, the carrier is selected from the group consisting of nonmetallic materials, metallic ceramics, and metallic materials having an oxide layer on their surface.

Nonmetallic materials that can be used include in particular polymers, glasses, and nonmetallic ceramics. According to a particularly preferred embodiment, the carrier is made of polyester, polyimide, or polyethersulfone.

Metallic ceramics are to be understood as ceramics containing at least one metal. For example, an aluminum oxide ceramic can be used as a metallic ceramic for the carrier.

Metallic materials having an oxide layer on their surface are preferably metals that passivate in the presence of atmospheric oxygen. These include in particular aluminum, nickel, and iron.

According to the present invention, the carrier has a surface having at least one structuring element containing hardened paste. According to the present invention, the at least one structuring element is situated on the surface of the carrier.

According to a preferred embodiment, the carrier has a surface having a plurality of structuring elements containing hardened paste. By definition, a plurality of structuring elements determines a structure. These structuring elements can have the same geometry or can have differing geometries. In addition, the individual structuring elements can be disposed uniformly or non-uniformly. Preferably, the structuring elements are situated on the carrier spaced from one another, i.e. in a plane.

The number and the geometry of the structuring elements, as well as the arrangement of the structuring elements on the carrier, are not further limited. Preferably, the number and geometry of the structuring elements, as well as the arrangement of the structuring elements on the carrier, are however selected such that the pattern produced by the structuring elements corresponds to the pattern with which individual components situated next to one another, for example in a plane, are to be fastened on another component.

For example, a plurality of electronic components, for example semiconductor chips, can be connected to a substrate, for example to a leadframe. Customarily, such a leadframe has contact points provided for the connection to the semiconductor chip. In such a case, the sintering preform can be realized such that structuring elements containing hardened paste are arranged on the surface of the carrier in a pattern that corresponds to the pattern of the contact points on the leadframe. This arrangement of the structuring elements on the carrier ensures that the structuring elements later equipped with the semiconductor chips can be transferred onto the contact points of the leadframe, and the semiconductor chips will be situated at the contact points provided for them on the leadframe.

The structuring elements on the surface of the carrier contain a hardened paste.

This paste is made such that it enables a stable connection of the components even at temperatures below 250° C.

The paste used according to the present invention contains metal particles (a).

In the context of the present invention, the term "metal particles" is not limited to particles made of pure metals. Rather, the term includes all particles having a metal portion. This metal portion is preferably at least 50% by weight, still more preferably at least 70% by weight, particularly preferably at least 90% by weight, and most particularly preferably at least 95% by weight, relative to the weight of the metal particles. In particular, the term "metal particles" also includes particles of a metal alloy or an intermetallic phase. In addition, the term "metal particles" also includes particles containing at least two layers that can have different metals, metal alloys, or intermetallic phases. These metal particles can in addition be metal particles of the same type or of different types. In particular, the paste can contain mixtures of different metal particles.

In the context of the present invention, the term "metal" refers to an element that, in the Periodic Table of the elements, is located in the same period as boron but to the left of boron, in the same period as silicon but to the left of silicon, in the same period as germanium but to the left of germanium, and in the same period as antimony but to the left of antimony, as well as to all elements whose atomic number is greater than 55.

According to a particularly preferred embodiment, the paste contains metal particles having a metal with a purity of at least 95% by weight, more preferably at least 98% by weight, still more preferably at least 99% by weight, and most particularly preferably at least 99.9% by weight.

According to a further preferred embodiment, the metal is selected from the group consisting of copper, silver, nickel, and aluminum. According to a particularly preferred embodiment, the metal is silver or copper. According to a most particularly preferred embodiment, the metal is silver.

If the paste used according to the present invention contains metal particles that include a metal alloy, this alloy preferably contains at least one metal selected from the group consisting of aluminum, nickel, copper, silver, gold, palladium, and platinum. According to a particularly preferred embodiment, the metal alloy contains at least two metals selected from the group consisting of aluminum, nickel, copper, silver, gold, palladium, and platinum. It can further be preferred that the portion of the metals selected from the group consisting of aluminum, nickel, copper, silver, gold, palladium, and platinum in the metal alloy is at least 90% by weight, more preferably at least 95% by weight, particularly preferably at least 99% by weight, and most particularly preferably 100% by weight. The alloy can for example be an alloy containing copper and silver; copper, silver, and gold; copper and gold; silver and gold; silver and palladium; platinum and palladium; or nickel and palladium.

If the paste used according to the present invention contains metal particles comprising at least two layers having different metals, metal alloys, or intermetallic phases, these are preferably particles of a metal, a metal alloy, or an intermetallic phase containing at least one metal selected from the group consisting of aluminum, nickel, copper, silver, gold, palladium, and platinum, wherein these particles are surrounded with a coating differing therefrom, made of a metal, a metal alloy, or an intermetallic phase, containing at least one metal selected from the group consisting of aluminum, nickel, copper, silver, gold, palladium, and platinum. Most particularly preferred are copper particles coated with silver.

The metal particles can have various shapes. For example, the metal particles can be present in the form of flakes or can have a spherical (ball-like) shape. According to a particularly preferred embodiment, the metal particles have the form of flakes. However, this does not exclude the possibility that, of the metal particles used, a minor portion can also have a different shape. However, it is preferred that at least 70% by weight, more preferably at least 80% by weight, still more preferably at least 90% by weight, or 100% by weight of the particles are present in the form of flakes.

If the metal particles are present in a spherical shape, the metal particles preferably have an average particle diameter of 0.1-20 µm, more preferably 1-15 µm, and still more preferably 2-10 µm. According to the present invention, "average particle diameter" is to be understood to mean that at least 90% of the particles have a particle diameter in the indicated range. For example, an average particle diameter of 0.1-20 µm means that at least 90% of the particles have a particle diameter in the range of 0.1-20 µm, and less than 10% of the particles have a particle diameter of less than 0.1 µm or greater than 20 µm.

According to the present invention, the metal particles are coated.

According to the present invention, a coating of particles is understood as an adhering layer on the surface of particles. According to the present invention, "adhering layer" means that the layer does not detach from the metal particles merely due to gravitation.

According to the present invention, the coating of the metal particles contains at least one coating compound. This at least one coating compound is an organic compound.

This at least one coating compound preferably comprises a compound selected from the group consisting of fatty acids, fatty acid salts, and fatty acid esters. These coating compounds are intended to prevent an agglomeration of the metal particles contained in the paste, and to contribute to the stabilization of the paste.

The coating compounds used according to the present invention are preferably selected from the group consisting of saturated compounds, monounsaturated compounds, polyunsaturated compounds, and mixtures thereof.

In addition, the coating compounds are selected from the group consisting of branched compounds, unbranched compounds, and mixtures thereof.

The coating compounds preferably have 8-28, still more preferably 12-24, and particularly preferably 12-18 carbon atoms.

According to a preferred embodiment, the coating compounds include monofatty acids, salts of monofatty acids, monofatty acid esters, and mixtures thereof.

Preferred fatty acid salts are salts whose anionic component represents the deprotonated fatty acid and whose cationic component is selected from the group consisting of ammonium ions, monoalkyl ammonium ions, dialkyl ammonium ions, trialkyl ammonium ions, lithium ions, sodium ions, potassium ions, copper ions, and aluminum ions.

Preferred fatty acid esters are derived from the corresponding fatty acids, wherein the hydroxyl groups of the acid units are substituted by alkyl groups, in particular methyl groups, ethyl groups, propyl groups, or butyl groups.

According to a preferred embodiment, the at least one coating compound is selected from the group consisting of caprylic acid (octanoic acid), capric acid (decanoic acid), lauric acid (dodecanoic acid), myristic acid (tetradecanoic acid), palmitic acid (hexadecanoic acid), stearic acid (octadecanoic acid), mixtures thereof, and the corresponding esters and salts as well as mixtures thereof.

According to a particularly preferred embodiment, the at least one coating compound is selected from the group consisting of lauric acid (dodecanoic acid), stearic acid (octadecanoic acid), sodium stearate, potassium stearate, aluminum stearate, copper stearate, sodium palmitate, and potassium palmitate.

The metal particles used according to the present invention are commercially obtainable. The coating compounds used according to the present invention can be applied onto the surface of the metal particles using conventional methods known from the prior art.

For example, it is possible to suspend the coating compounds, in particular the above-mentioned stearates or palmitate, in solvents, and to grind the suspended coating compounds in ball mills with the metal particles. After the grinding, the metal particles, now coated with the coating compounds, are dried and are then dedusted.

Preferably, the portion of the at least one coating compound selected from the group consisting of fatty acids, fatty acid salts, and fatty acid esters is at least 80% by weight, more preferably at least 90% by weight, particularly preferably at least 95% by weight, most particularly preferably at least 99% by weight, and in particular 100% by weight, relative to the total weight of the coating.

According to a preferred embodiment, the portion of the coating compounds is 0.05-3% by weight, more preferably 0.07-2.5% by weight, and still more preferably 0.1-2.2% by weight, relative to the weight of the coated metal particles.

The degree of coating, defined as the ratio of the mass of coating compounds to the surface of the metal particles, is preferably 0.00005-0.03 g, more preferably 0.0001-0.02 g, and still more preferably 0.0005-0.02 g of coating compounds per square meter ($m^2$) of surface of the metal particles.

According to the present invention, the paste contains at least one sintering aid. During the sintering process at temperatures below 250° C., this sintering aid is preferably capable of ensuring a burning off of the coating compounds at less than 250° C., in order in this way to enable sintering at temperatures below 250° C. Particularly suitable sintering aids ensure a burning off of the coating compounds at temperatures below 250° C. either directly or indirectly via intermediately formed compounds.

According to the present invention, the sintering aid is selected from the group consisting of (b1) organic peroxides, (b2) inorganic peroxides, (b3) inorganic acids, (b4) salts of organic acids, wherein the organic acids have 1-4 carbon atoms, (b5) esters of organic acids, wherein the organic acids have 1-4 carbon atoms, and (b6) carbonyl complexes.

The organic peroxides (b1), inorganic peroxides (b2), and inorganic acids (b3) that can be used as sintering aids according to one embodiment are oxidizing agents.

An oxidizing agent is to be understood as a substance that can oxidize other substances while itself being reduced. An oxidizing agent can take up electrons and is therefore an electron acceptor. Preferably, the sintering aid according to this embodiment is also an oxygen transfer agent. This refers to a substance that can give off oxygen. These compounds can act as sintering aids, because they contain at least one oxygen atom and enable combustion of the coating compounds present on the metal particles of the paste at a temperature below 250° C.

The suitability of (b1) organic peroxides, (b2) inorganic peroxides, and (b3) inorganic acids for use as sintering aids is based on the recognition that for the sintering of components using paste it is advantageous if the particles contained in the paste are coated, preferably with fatty acids. If the metal particles are not coated, there results an agglomeration of the metal particles in the metal paste and clumping of the metal particles in an early stage of the sintering process. This often results in inhomogenous contact points between the components to be connected.

Surprisingly, however, it has been discovered that metal particles coated in this way also have the effect that the sintering temperature cannot be lowered below 250° C. As long as the coating compounds are present on the surface of the metal particles, an agglomeration of the metal particles is indeed on the one hand prevented. On the other hand, however, the surfaces of the metal particles are then not available for the sintering step, so that the metal particles cannot be sintered.

In conventional sintering methods, the coating compounds are burned off during the sintering process, at the temperatures far above 250° C. customarily used for sintering. The surfaces of the metal particles are accessible for the sintering process only after the coating compounds have been burned off. Therefore, sintering processes using coated metal particles as conventionally used are possible only at temperatures well above 250° C.

Surprisingly, it has been found that (b1) organic peroxides, (b2) inorganic peroxides, and (b3) inorganic acids ensure a burning off of the coating compounds at temperatures below 250° C. These sintering aids are oxygen-containing oxidizing agents, which ensure that the coating compounds on the metal particles are removed at temperatures below 250° C. Thus, even at temperatures below 250° C. the surfaces of the metal particles are available for the sintering process. Also surprising was the finding that, despite the burning off of the coating compounds at temperatures below 250° C., an agglomeration of the metal particles did not occur, but instead homogenous and stable contact points were created between the components to be connected.

In addition, a further surprising finding was that the surface of the metal particles under the coating layer was in most cases at least partly oxidized. Such metal oxide layers impair the diffusion processes required for the sintering, and thus cause a retardation of the diffusion speed. For this reason, during sintering with these metal particles oxidized on the surface, it is customarily necessary to use high process temperatures well above 250° C.

According to the present invention, during the burning off of the coating compounds there results, inter alia, carbon monoxide. The carbon monoxide released during the sintering is a reducing agent, and as such is capable of reducing the metal oxide present on the surface of the metal particles. The removal of the metal oxide ensures a diffusion free of hindrance, and therewith an increase in the diffusion speed. Moreover, during this reduction of the metal oxide reactive metal is produced in situ, which further promotes the sintering process. In addition, this reactive metal can fill the gaps present between the metal atoms of the metal particles during the sintering process, and can thus significantly reduce the porosity of the contact points between the components to be connected. In this way, extremely stable contact points are produced having very high thermal conductivity and electrical conductivity.

In the context of the present invention, (b1) organic peroxides are to be understood as compounds containing the peroxide anion $O_2^{2-}$ or the peroxide group —O—O—, as well as at least one organic group linked directly to the peroxide group. In the context of the present invention, organic peroxides can therefore also contain inorganic groups linked directly to the peroxide group, as long as at least one organic group is present that is directly linked to the peroxide group. This linkage is preferably covalent.

Organic groups are preferably to be understood as groups containing at least one carbon atom, wherein the carbon atom is linked directly to the peroxide group, preferably by a covalent bond.

According to a preferred embodiment, the organic peroxides that can be used according to the present invention are hydroperoxides as well as peroxycarboxylic acids and salts thereof. Peroxycarboxylic acids are derived from carboxylic acids, wherein the hydroxyl group of the carboxylic acid unit is preferably substituted by a hydroxy peroxyl group. Hydroperoxides are formally derived from ethers or alcohols, wherein the oxygen bridge that connects the alkyl, alkenyl, or aryl groups to one another or to a hydrogen atom is substituted by a peroxide group.

The organic peroxides used according to the present invention have at least one peroxide group. They can thus also have two or more peroxide groups.

In the organic peroxide used according to the present invention, the organic groups can be of the same type or of different types.

The organic groups can themselves bear heteroatoms. In this case, the heteroatoms are preferably oxygen atoms, nitrogen atoms, or halogen atoms. If the organic groups contain halogen atoms, then fluorine atoms, chlorine atoms, bromine atoms, or iodine atoms are preferred. The heteroatoms can also be part of a functional group. Preferred functional groups are carboxylic acid groups, ester groups, keto groups, aldehyde groups, hydroxyl groups, amino groups, amide groups, azo groups, imide groups, cyano groups, or nitrile groups.

The organic groups of the organic peroxides preferably have 1-20, more preferably 2-15, and still more preferably 2-10 carbon atoms.

The organic groups can be branched or unbranched.

The organic groups can include aliphatic or aromatic groups.

In the case of aliphatic groups, the organic group can also include a cyclic group. The ring of the cyclic group preferably comprises 4-8 atoms, which can preferably be carbon atoms. The ring of the cyclic group can however also contain heteroatoms, preferably one or more nitrogen atoms or oxygen atoms.

In the case of aromatic groups, the organic group can include aromatic groups, preferably having 5 or 6 carbon atoms.

The organic groups can be saturated or unsaturated. Accordingly, the organic groups can contain multiple bonds, preferably double bonds, but also triple bonds.

The organic peroxides can also contain at least one inorganic group linked directly to the peroxide group.

Inorganic groups are to be understood according to the present invention as groups linked to the peroxide group of the organic peroxide, wherein the linkage does not take place via a carbon atom.

The linkage of the inorganic group to the peroxide group of the organic peroxide can in principle take place via all atoms other than carbon atoms. The linkage preferably takes place via a hydrogen atom or a heteroatom. Metal atoms or nitrogen atoms can be preferred as the heteroatom.

If heteroatoms are linked directly to the peroxide group, then the heteroatom can be part of a group that contains other atoms in addition to the heteroatom. These other atoms can preferably include carbon atoms, hydrogen atoms, or additional heteroatoms. Preferred additional heteroatoms can be nitrogen atoms, oxygen atoms, phosphorus atoms, and halogen atoms, such as fluorine atoms, chlorine atoms, bromine atoms, or iodine atoms.

Metal atoms that can be linked directly to the peroxide group are preferably metals of the first, second, and third groups of the Periodic Table of the elements. Accordingly, according to a preferred embodiment, lithium atoms, sodium atoms, potassium atoms, beryllium atoms, magnesium atoms, calcium atoms, strontium atoms, boron atoms, or aluminum atoms are linked to the peroxide group.

The inorganic group linked to the peroxide group via a heteroatom can preferably be an ammonium group. It can also be preferred that one or more hydrogen atoms of the ammonium group be substituted with organic or inorganic groups. Preferably, one or more hydrogen atoms of the ammonium group are substituted with alkyl groups. These alkyl groups can be branched or unbranched, but are preferably unbranched. The alkyl groups that substitute for one or more hydrogen atoms of the ammonium group preferably have 1-10, more preferably 1-6, and still more preferably 1-4 carbon atoms. The alkyl groups that substitute for one or more hydrogen atoms of the ammonium group can be of the same type or of different types.

Preferred inorganic groups are ammonium groups, monomethylammonium groups, dimethylammonium groups, trimethylammonium groups, monoethylammonium groups, diethylammonium groups, triethylammonium groups, monopropylammonium groups, dipropylammonium groups, tripropylammonium groups, monoisopropylammonium groups, diisopropylammonium groups, triisopropylammonium groups, monobutylammonium groups, dibutylammonium groups, and tributylammonium groups.

The organic peroxide used according to the present invention can also comprise a cyclic organic peroxide. In particular, the peroxide group of the organic peroxide can itself be part of a cyclic system.

The organic peroxides used according to the present invention preferably have a decomposition temperature of below 200° C. In this context, however, it has surprisingly been found that some organic peroxides having a decomposition temperature of greater than 200° C. have a decomposition temperature of below 200° C. in the presence of metal contained in the metal paste. This appears to be due to the fact that metal contained in the metal paste catalyzes the decomposition of these organic peroxides.

It can also be preferred that the organic peroxides used according to the present invention are liquid at room temperature (20° C.) and standard pressure (1013 hPa).

In particularly preferred embodiments, the organic peroxide comprises a compound selected from the group consisting of diisobutyryl peroxide, cumene peroxyneodecanoate, 1,1,3,3-tetramethylbutyl peroxyneodecanoate, di-n-propyl peroxydicarbonate, tert-amyl peroxyneodecanoate, di-(2-ethylhexyl)peroxydicarbonate, tert-butyl peroxyneodecanoate, di-n-butyl peroxydicarbonate, 1,1,3,3-tetramethylbutyl peroxypivalate, tert-butyl peroxyneoheptanoate, tert-amyl peroxypivalate, tert-butyl peroxypivalate, di-(3,5,5-trimethylhexanoyl)peroxide, tert-butyl-peroxy-2-ethylhexanoate, tert-butyl peroxyisobutyrate, 1,1-di-(tert-butylperoxy)-3,3,5-trimethylcyclohexane, 1,1-di-(tert-butylperoxy)-cyclohexane, tert-butyl-peroxy-3,5,5-trimethylhexanoate, 2,2-di-(tert-butylperoxy)-butane, tert-butylperoxyisopropyl-carbonate, tert-butyl peroxyacetate, 2,5-dimethyl-2,5-di(2-ethylhexanoylperoxy)-hexane, 1,1,3,3-tetramethylbutyl-peroxy-2-ethylhexanoate, tert-amyl-peroxy-2-ethylhexanoate, tert-butyl peroxydiethylacetate, tert-amyl-peroxy-2-ethylhexylcarbonate, tert-butyl-peroxy-2-ethylhexylcarbonate, tert-butyl peroxybenzoate, di-tert amylperoxide, 2,5-dimethyl-2,5-di-(tert-butylperoxy)-hexane, tert-butylcumyl peroxide, 2,5-dimethyl-2,5-di(tert-butylperoxy)hexyne-3, di-tert-butyl peroxide, 3,6,9-triethyl-3,6,9-trimethyl-1,4,7-triperoxonane, di-isopropylbenzene monohydroperoxide, p-menthane hydroperoxide, cumene hydroperoxide, dicumyl peroxide, and 1,1,3,3-tetramethylbutyl hydroperoxide.

As sintering aids, (b2) inorganic peroxides can also be used.

In the context of the present invention, inorganic peroxides are understood as compounds that contain the peroxide anion $O_2^{2-}$ or the peroxide group —O—O—, as well as exclusively inorganic groups. In the context of the present invention, inorganic peroxides are preferably all peroxides that are not organic peroxides. According to the present invention, inorganic groups are groups linked directly to the peroxide group via an atom other than a carbon atom.

Two inorganic groups, which are bonded to a peroxide group of the inorganic peroxide, can be of the same type or of different types.

The linkage to the peroxide group can preferably take place via one or more hydrogen atoms and/or one or more heteroatoms. Metal atoms, boron atoms, or nitrogen atoms can be preferred as heteroatoms.

If heteroatoms are linked directly to the peroxide group, then the heteroatom can be part of a group that contains additional atoms besides the heteroatom. According to a preferred embodiment, these additional atoms can include carbon atoms, hydrogen atoms, or additional heteroatoms. Nitrogen atoms, oxygen atoms, phosphorus atoms, and halogen atoms, in particular fluorine atoms, chlorine atoms, bromine atoms, or iodine atoms, can be preferred as additional heteroatoms.

Preferred metal atoms that can be linked directly to the peroxide group are metals of the first, second, and third groups of the Periodic Table of the elements. Consequently, lithium atoms, sodium atoms, potassium atoms, beryllium atoms, magnesium atoms, calcium atoms, strontium atoms, boron atoms, or aluminum atoms can preferably be linked to the peroxide group.

Preferably, the at least one inorganic group linked via a heteroatom to the peroxide group of the inorganic peroxide comprises an ammonium group. If, in the inorganic peroxide, two ammonium groups are bonded to a peroxide group, then the ammonium groups can be of the same type or of different types.

It can also be preferred that one or more hydrogen atoms of the ammonium group are substituted with organic or inorganic groups. Preferably, in this case one or more hydrogen atoms of the ammonium group are substituted with alkyl groups. These alkyl groups can be branched or unbranched, but are preferably unbranched. The alkyl groups that substitute for one or more hydrogen atoms of the ammonium group preferably have 1-10, more preferably 1-6, and still more preferably 1-4 carbon atoms. The alkyl groups that substitute for one or more hydrogen atoms of the ammonium group can be of the same type or of different types.

Preferred inorganic groups are ammonium groups, monomethylammonium groups, dimethylammonium groups, trimethylammonium groups, monoethylammonium groups, diethylammonium groups, triethylammonium groups, monopropylammonium groups, dipropylammonium groups, tripropylammonium groups, monoisopropylammonium groups, diisopropylammonium groups, triisopropylammonium groups, monobutylammonium groups, dibutylammonium groups, and tributylammonium groups.

The inorganic peroxide can also be a peroxoborate. According to the present invention, peroxoborates are understood to be borates in which at least one oxygen atom is substituted by a peroxide group. According to the present invention, borates are salts or esters of boric acid. The peroxoborates can preferably also be present as hydrates. Further, the peroxoborates can be peroxosalts having a ring-shaped anion.

Preferred peroxoborates are ammonium perborates, alkyl ammonium perborates, and alkali perborates.

According to the present invention, the term "alkyl ammonium perborates" refers to ammonium perborates in which one or more hydrogen atoms of the ammonium unit are substituted with one or more alkyl groups. These alkyl groups can be branched or unbranched. Preferably, these alkyl groups have 1-10 carbon atoms, more preferably 1-6 carbon atoms, and still more preferably 1-4 carbon atoms.

Preferred alkali perborates are lithium perborate, potassium perborate, and sodium perborate.

The inorganic peroxides used according to the present invention preferably have a decomposition temperature of not more than 200° C.

Further, it can be preferred that the inorganic peroxides used according to the present invention are liquid at room temperature (20° C.) and standard pressure (1013 hPa).

According to a particularly preferred embodiment, the following are used as inorganic peroxides: hydrogen peroxide, ammonium peroxide, monomethylammonium peroxide, dimethylammonium peroxide, trimethylammonium peroxide, monoethylammonium peroxide, diethylammonium peroxide, triethylammonium peroxide, monopropylammonium peroxide, dipropylammonium peroxide, tripropylammonium peroxide, monoisopropylammonium peroxide, diisopropylammonium peroxide, triisopropylammonium peroxide, monobutylammonium peroxide, dibutylammonium peroxide, tributylammonium peroxide, lithium peroxide, sodium peroxide, potassium peroxide, magnesium peroxide, calcium peroxide, barium peroxide, ammonium perborate, lithium perborate, potassium perborate, or sodium perborate.

According to a particularly preferred embodiment, the inorganic peroxides include hydrogen peroxide, ammonium peroxide, sodium peroxide, and ammonium perborate.

Inorganic acids (b3) can in addition also act as sintering aids contained in the paste used according to the present invention.

Preferably, the inorganic acids are inorganic acids containing oxygen.

According to a further preferred embodiment, phosphoric acids are used as inorganic acids. Phosphoric acids are to be understood in general as inorganic acids having at least one phosphorus atom.

Preferred phosphoric acids that can be used according to the present invention as sintering aids are orthophosphoric acid, diphosphoric acid, metaphosphoric acids, and polyphosphoric acids.

According to a further preferred embodiment, the at least one sintering aid is (b4) a salt of an organic acid, wherein the organic acid has 1-4 carbon atoms, (b5) an ester of an organic acid, wherein the organic acid has 1-4 carbon atoms, or (b6) a carbonyl complex. These sintering aids clearly ensure that the metal oxides, which interfere with the sintering process and that can be present on the surface of the metal particles contained in the paste, are reduced. For this reason, it is also possible to use as sintering aids those compounds that release a reducing agent during the sintering process. This reducing agent is preferably carbon monoxide. Salts of organic acids, wherein the organic acids have 1-4 carbon atoms, esters of organic acids, wherein the organic acids have 1-4 carbon atoms, and carbonyl complexes can act as sintering aids, because they clearly release carbon monoxide during the sintering process and thus enable a reduction of the metal oxides on the surface of the metal particles in the paste to the corresponding metal at a temperature of less than 250° C.

The suitability of (b4) salts of organic acids, wherein the organic acids have 1-4 carbon atoms, (b5) esters of organic acids, wherein the organic acids have 1-4 carbon atoms, and (b6) carbonyl complexes for use as sintering aids is also due to the above-explained finding that for the sintering of components using pastes it is on the one hand advantageous if the particles contained in the paste are coated, preferably with fatty acids, in order to prevent an agglomeration of the particles, but on the other hand this coating has the effect that the sintering temperature cannot be lowered below 250° C. The suitability of the compounds used according to this embodiment for use as sintering aids is in addition also based on the above-explained finding that the surface of the metal particles under the coating layer is for the most part at least partly oxidized, and that this impairs the diffusion processes required for the sintering.

Salts of organic acids, wherein the organic acids have 1-4 carbon atoms, esters of organic acids, wherein the organic acids have 1-4 carbon atoms, and carbonyl complexes can be used according to the present invention as sintering aids, because they release carbon monoxide during the sintering process, or carbon monoxide is formed during their combustion. The carbon monoxide released during the sintering is a reducing agent, and as such is capable of reducing the metal oxide on the surface of the metal particles. The removal of the metal oxide ensures a diffusion free of hindrance, and therewith an accompanying increase in the diffusion speed. Moreover, with this reduction of the metal oxide in situ, reactive metal is produced, which further promotes the sintering process. In addition, this reactive metal can fill gaps present between the metal atoms of the metal particles during the sintering process, and can thus significantly reduce the porosity of the contact points between the components to be connected. In this way, extremely stable, thermally conductive, and electrically conductive contact points are produced.

For an as yet unknown reason, salts of organic acids, wherein the organic acids have 1-4 carbon atoms, esters of organic acids, wherein the organic acids have 1-4 carbon atoms, and carbonyl complexes also appear to promote the burning off of the coating compounds contained on the silver particles at temperatures below 250° C. Thus, at temperatures below 250° C. the surfaces of the metal particles are already available for the sintering process.

According to the present invention, (b4) salts of organic acids having 1-4 carbon atoms can be used as sintering aids.

According to a preferred embodiment, a salt of an organic acid is used that contains 1-3 carbon atoms.

In the context of the present invention, organic acids are organic compounds having at least one carboxylic acid group. They can be represented by the following formula:

R—COOH                                                      Formula (I), where R stands for an organic group.

Correspondingly, according to the present invention salts of organic acids are compounds containing at least one anionic component having at least one unit that has a carboxylic acid group in which formally a proton is split off, and that have as cationic a component a cation type differing from protons. Consequently, salts of organic compounds can be represented by the following formula:

R—COOX                                                   Formula (II), where X stands for any cationic component.

According to the present invention, R stands for an organic group having 1-3 carbon atoms.

In the context of the present invention, it can be preferred that the salt in the metal paste is not present in dissociated form. Correspondingly, in a embodiment of the present invention in which a salt of an organic acid having 1-4 carbon atoms is used as a sintering aid, an aprotic solvent is preferably used as solvent contained in the paste according to the present invention.

The organic acid having 1-4 carbon atoms can preferably be a monoacid or a diacid. The organic acid can be a monoprotic acid or a polyprotic acid, in particular a diprotic acid.

Besides the at least one carboxylic acid group, the organic acid can also have at least one additional functional group. This functional group can be, for example, another carboxylic acid group, ester group, keto group, aldehyde group, hydroxyl group, amino group, amide group, imide group, cyano group, nitrile group, or a halogen atom, in particular a fluorine atom, chlorine atom, or bromine atom.

Besides the double bond formally contained in the C=O group of the at least one carboxylic acid unit, the organic acid can contain further double bonds.

Preferably, as sintering aids salts are used of an acid selected from the group consisting of acetic acid, carbonic acid, formic acid, lactic acid, and oxalic acid.

Metal cations can preferably be used as the cationic component of the salts used according to the present invention.

The metal cations are preferably cations of metals that have a high affinity for oxygen. It is assumed that these metals can bind oxygen during the sintering process, and can thus shift to the product side the equilibrium of the reaction of carbon monoxide released by sintering aids with the metal oxides on the surface of the metal particles to form carbon dioxide and the metals.

Preferred metal cations are magnesium, aluminum, copper (I), copper (II), silver (I), silver (II), manganese (III), iron (II), iron (III), cobalt (II), and tin (II).

According to a particularly preferred embodiment, the at least one salt of an organic acid having 1-4 carbon atoms, used as a sintering aid, is selected from the group: copper(II) acetate, iron(II) acetate, tin(II) acetate, iron(II) carbonate, copper(II) carbonate, magnesium formate, aluminium formate, iron(II) formate, tin(II) formate, copper(II) formate, silver(II) formate, manganese(III) formate, copper(II) lactate, silver(I) lactate, iron(II) oxalate, iron(III) oxalate, and cobalt(II) oxalate.

However, embodiments also fall within the scope of the present invention in which it can be excluded that the metal paste contains, as a salt of an organic acid having 1-4 carbon atoms, a carbonate, lactate, or formate of copper, silver, gold, nickel, palladium, or platinum, in particular silver carbonate, silver lactate, silver formate, or copper lactate.

According to the present invention, (b5) an ester of an organic acid, wherein the organic acid has 1-4 carbon atoms, can also be used as a sintering aid.

The organic acid having 1-4 carbon atoms, from which the ester used according to the present invention is derived, is preferably an organic acid having 1-4 carbon atoms, as described above in connection with salts of organic acids having 1-4 carbon atoms.

As a consequence, the ester used according to the present invention is preferably a monoester or a polyester, in particular a diester.

In the context of the present invention, an ester is a compound in which at least one hydrogen of the at least one carboxylic acid unit of the organic acid having 1-4 carbon atoms is formally substituted by an organic group.

Accordingly, esters represent compounds that can be described by the above formula (II), but wherein the group X represents an organic group.

If diesters are used as esters of organic acids having 1-4 carbon atoms, then formally the hydrogen atoms of two carboxylic acid units or the hydrogen atoms of a carboxylic acid unit of a diprotic acid are substituted by organic groups. These organic groups can be of the same type or of different types.

According to the present invention, this at least one organic group, which formally substitutes for a hydrogen atom in the at least one carboxylic acid unit of the organic acid having 1-4 carbon atoms, is preferably a group having 1-10, more preferably 1-7, and still more preferably 1-4 carbon atoms.

This organic group can be unbranched or branched, but is preferably unbranched.

The organic group can bear one or more heteroatoms. Possible heteroatoms here are in particular oxygen, nitrogen, and halogens, such as fluorine, chlorine, bromine, or iodine. However, it can also be preferred that the organic group bears no heteroatoms.

If heteroatoms are present in the organic group, they can be part of a functional group. Examples of such functional groups are carboxylic acid groups, ester groups, keto groups, aldehyde groups, amino groups, amide groups, azo groups, imide groups, cyano groups, and nitrile groups.

The organic group can be an aliphatic or an aromatic group. Preferably, the organic group is an aliphatic group.

According to a particularly preferred embodiment, the aliphatic group is an alkyl group. This alkyl group preferably has 1-10, more preferably 1-7, and still more preferably 1-4 carbon atoms. According to this embodiment, the alkyl group is unbranched. Preferably, this alkyl group contains no heteroatoms. Particularly preferred alkyl groups are methyl groups, ethyl groups, propyl groups, and butyl groups.

Consequently, the esters of organic acids used according to the present invention, wherein the organic acids have 1-4 carbon atoms, are preferably selected from the group consisting of methyl esters, ethyl esters, propyl esters, and butyl esters.

According to this embodiment, the esters of organic acids according to the present invention having 1-4 carbon atoms are compounds which can be represented by formula (II), wherein group X stands for an alkyl group, preferably a methyl group, ethyl group, propyl group, or butyl group.

Particularly preferred esters of organic acids having 1-4 carbon atoms are consequently methyl acetate, ethyl acetate, propyl acetate, butyl acetate, dimethyl carbonate, diethyl carbonate, dipropyl carbonate, dibutyl carbonate, methyl ethyl carbonate, methyl propyl carbonate, methyl butyl carbonate, ethyl propyl carbonate, ethyl butyl carbonate, methyl formate, ethyl formate, propyl formate, butyl formate, methyl lactate, ethyl lactate, propyl lactate, butyl lactate, dimethyl oxalate, diethyl oxalate, dipropyl oxalate, and dibutyl oxalate.

According to the present invention, (b6) carbonyl complexes can also be used as sintering aids.

According to the present invention, the term "carbonyl complexes" describes metal complexes containing carbonyl groups, in which at least one CO molecule is coordinately bound to at least one metal atom.

Besides the at least one CO molecule, the carbonyl complexes can also contain additional ligands. These additional ligands can be elemental or molecular ligands.

The ligands can be unidentate or polydentate.

Preferred elementary ligands are hydrogen and halogens. Preferred halogens are fluorine, chlorine, bromine, and iodine.

Preferred molecular ligands are nitrogen oxides, cyanides, and organic ligands.

The organic ligands are preferably ionic or unsaturated ligands.

Possible organic ligands here are organic ligands having at least one carbon atom. Preferably, the organic ligands having at least one carbon atom are organic ligands having 2-20, more preferably 2-16, and still more preferably 2-12 carbon atoms.

The organic ligands can be branched or unbranched.

The organic ligands can further be saturated, or mono- or polyunsaturated.

Further, the organic ligands can have a ring structure. This ring structure can also contain at least one heteroatom. This at least one heteroatom can preferably be nitrogen or oxygen.

The organic ligands can also be aromatic ligands.

Alkyl ligands, preferably unbranched alkyl ligands such as methyl ligands, or cyclopentadienyl can be preferred as ionic ligands.

As unsaturated organic ligands, alkenes, conjugated or unconjugated dienes, and allyls can be preferred. According to the present invention, π-allyl and aromatic transition metal complexes are also provided as organic groups.

The carbonyl complexes used according to the present invention can contain one or more metal atoms. If the carbonyl complexes contain a plurality of metal atoms, then these metal atoms can be of the same type or of different types.

Metals that have a high affinity to oxygen are preferably used as metals of the carbonyl complexes.

Preferably, the carbonyl complexes have at least one element from the transition metals, thus elements from the third through the eleventh groups of the Periodic Table of the elements.

According to the present invention, it can further be preferred that the at least one metal of the metal carbonyls used according to the present invention is a metal selected from the group consisting of vanadium, molybdenum, tungsten, manganese, iron, ruthenium, osmium, cobalt, and nickel.

According to a preferred embodiment, the carbonyl complexes are metal carbonyls.

In the context of the present invention, the term "metal carbonyls" is intended to describe compounds that are mono- or polynuclear coordination compounds, in which exclusively carbon monoxide molecules are coordinately bound to metal atoms.

Metal carbonyls can according to the present invention contain one metal atom or a plurality of metal atoms.

The metal atoms contained in the metal carbonyls can be of the same type or of different types.

Preferably, the metal atoms of the metal carbonyls are elements from the transition metals, thus elements from the third through eleventh groups of the Periodic Table of the elements.

According to a preferred embodiment, the at least one metal of the metal carbonyls used according to the present invention is a metal selected from the group consisting of vanadium, molybdenum, tungsten, manganese, iron, ruthenium, osmium, cobalt, and nickel.

The metal carbonyls can be charge-neutral or can be present as a salt. The salt can be a monovalent salt or a polyvalent salt.

According to a preferred embodiment, the metal complex used according to the present invention as a sintering aid is a metal complex selected from the group consisting of: vanadium hexacarbonyl ($V(CO)_6$), molybdenum hexacarbonyl ($Mo(CO)_6$), tungsten hexacarbonyl ($W(CO)_6$), dimanganese decacarbonyl ($Mn_2(CO)_{10}$), methylcyclopentadienyl manganese tricarbonyl (($CH_3C_5H_4)Mn(CO)_3$), iron pentacarbonyl ($Fe(CO)_5$), diiron nonacarbonyl ($Fe_2(CO)_9$), triiron dodecacarbonyl ($Fe_3(CO)_{12}$), diprototetracarbonyl ferrate(II) ($H_2$-[Fe$(CO)_4$]), iron dicarbonyldiiodide ($Fe(CO)_2I_2$), tripotassium carbonylpentacyanoferrate ($K_3$[Fe(CN)$_5$CO], 1,2-bis-(hexamethylbenzene)-tetracarbonyldiiron(0) ($C_{12}H_{18}Fe(CO)_4Fe$ $C_{12}H_{18}$), carbidopentaironpentadecacarbonyl ($Fe_5C(CO)_{15}$, ruthenium pentacarbonyl ($Ru(CO)_5$, diruthenium nonacarbonyl ($Ru_2(CO)_9$), triruthenium dodecacarbonyl ($Ru_3(CO)_{12}$), hexaruthenium hexadecacarbonyl ($Ru_6(CO)_{16}$), osmium pentacarbonyl ($Os(CO)_5$), triosmium dodecacarbonyl ($Os_3(CO)_{12}$), pentaosmium hexadecacarbonyl ($Os_5(CO)_{16}$), hexaosmium octadecacarbonyl ($Os_6(CO)_{18}$), dicobalt octacarbonyl ($Os_2(CO)_8$), tetracobalt dodecacarbonyl ($Os_4(CO)_{12}$), hexacobalt hexadecacarbonyl ($CO_6(CO)_{16}$), nickel tetracarbonyl ($Ni(CO)_4$) disodium carbonylferrate ($Na_2$[Fe$(CO)_4$]).

Through the use of the above-described sintering aids, the process temperature during sintering can thus be significantly reduced. Here it is surprising that, despite the burning off of the coating compounds at temperatures below 250° C., an agglomeration of the metal particles does not take place, but instead homogenous and stable contact points are formed between the components to be connected.

According to a particularly preferred embodiment, the molar ratio of sintering aids to the organic compounds (coating compounds) contained in the coating of the metal particles is in the range of 1:1 to 150:1, more preferably in the range of 3:1 to 100:1, still more preferably in the range of 5:1 to 80:1, and in particular in the range of 10:1 to 80:1. According to the present invention, "molar ratio of sintering aids to coating compounds" designates the quotient of (i) the sum of the amounts of substance of the sintering aids contained in the paste and (ii) the sum of the amounts of substance of the coating compounds contained in the coating of the metal particles. For example, if a paste contains 0.025 mol aluminum formate and 0.015 mol copper formate as sintering aids, and contains 0.0008 mol potassium stearate as the single coating compound, then the molar ratio of sintering aids to coating compounds is 50:1.

A ratio of sintering aids to coating compounds within the range preferred according to the present invention has further advantageous effects. Thus, on the one hand this ensures that during the sintering process, as a result of the combustion of the coating compounds, sufficient carbon monoxide is available for the reduction of the metal oxides. On the other hand, the quantity of sintering aids is then still not so high as to impair the sintering process. As explained above, according to the present invention it can be preferred for the organic compounds contained in the coating of the metal particles to be free fatty acids, fatty acid salts, or fatty acid esters, preferably having 10-24, and more preferably 12-18, carbon atoms.

The above-described effects appear to have the result that the use of these sintering aids succeeds in lowering the sintering temperature to below 250° C., while nonetheless producing stable, thermally conductive, and electrically conductive contact points between the components to be connected by the sintering process.

According to a preferred embodiment, the paste contains at least one metal precursor.

In the context of the present invention, a metal precursor is understood to be a compound that, at temperatures below 250° C., decomposes to form the metal of the metal precursor in the presence of the metal particles contained in the paste. Preferably, with the use of a metal precursor in the sintering process, a metal is accordingly formed in situ. It can easily be determined whether a compound is a metal precursor according to this preferred embodiment. Thus, for example a paste containing a compound to be tested can be deposited onto a substrate having a silver surface, heated to 250° C. and left at this temperature for 20 minutes. Thereafter, it is tested whether under these conditions the compound being tested has decomposed to form a metal. For this purpose, for example before the test the content of the metal-containing paste constituents is weighed, and from this the theoretical mass of the metal is calculated. After the test, the mass of the material deposited on the substrate is determined gravimetrically. If the mass of the material deposited on the substrate corresponds to the theoretical mass of the metal, taking into account the standard measurement deviations, then the tested compound is a metal precursor according to this preferred embodiment.

According to another preferred embodiment, the metal precursor has a metal that is also contained in the metal particles. According to a particularly preferred embodiment, the metal precursor therefore contains silver or copper as a metal.

As a metal precursor, it can be preferred to use metal carbonates, metal lactates, metal formates, metal citrates, metal oxides, or metal fatty acid salts, preferably fatty acid salts having 6 to 24 carbon atoms.

In particular embodiments, silver carbonate, silver(I) lactate, silver(II) formate, silver citrate, silver oxide (for example AgO or $Ag_2O$), copper(II) lactate, copper stearate, copper oxides (for example $Cu_2O$ or $CuO$), or gold oxides (for example $Au_2O$ or $AuO$), are used as metal precursors.

According to a particularly preferred embodiment, the metal precursor is selected from the group consisting of silver carbonate and silver oxides.

If present, the metal precursor is preferably present in the paste in particulate form, particularly preferably in the form of flakes.

The use of a metal precursor that releases metal in situ during the sintering process has the consequence that during the sintering process the metal formed in situ closes gaps between the metal particles contained in the paste. In this way, the porosity of a contact point between two components to be connected can be reduced.

At least in its non-hardened state, the paste also contains at least one compound that can act as a solvent. For this purpose, the solvents customarily used for metal pastes may be considered. For example, the following can be used as solvents: α-terpineol ((R)-(+)-α-terpineol, (S)-(−)-α-terpineol or racemate), β-terpineol, γ-terpineol, δ-terpineol, mixtures of the above-named terpineols, N-methyl-2-pyrrolidone, ethylene glycol, dimethylacetamide, 1-tridecanol, 2-tridecanol, 3-tridecanol, 4-tridecanol, 5-tridecanol, 6-tridecanol, isotridecanol, dibasic esters (preferably dimethylesters of glutaric, adipinic, or succinic acid, or mixtures thereof), glycerin, diethylene glycol, triethylene glycol, or mixtures thereof.

The paste can in addition contain at least one polymer, in order to impart desired properties to the paste. On the other hand, however, it can be advantageous for the paste to contain no polymers, or for the portion thereof to be small, because polymers, in particular thermosetting materials, customarily burn out at temperatures above 250° C., and therefore have a disadvantageous effect on the sinterability of the paste. This is true in particular of thermosetting materials or precursor products thereof. Precursor products of thermosetting materials are understood to be compounds that can harden to form thermosetting materials in the presence of additional paste constituents. These thermosetting materials or precursor products thereof customarily have a weight average molecular weight of less than 700. According to a preferred embodiment, the portion of polymers having a weight average molecular weight of less than 700 is not more than 6% by weight, relative to the total weight of the paste.

In addition, the metal paste can contain further ingredients, as for example usual dispersants, surfactants, anti-foaming agents, binders, or agents that control viscosity.

The paste used according to the present invention is preferably applied onto a surface of a carrier, in order to produce at least one structuring element. These structuring elements on the surface of the carrier therefore at first have paste that is not yet hardened and that is thereafter hardened.

The application of the paste onto the surface of the carrier takes place in such a way that the desired pattern of structuring elements, which contain the paste, is created on the surface of the carrier.

The application of the paste onto the surface of the carrier can be accomplished using conventional methods. Preferably, the paste is applied using a printing method, for example by screen printing or stencil printing.

The distances between the individual structuring elements are preferably selected so that a pattern is produced that corresponds to the pattern in which the components, later situated next to one another on the sintering preform, are arranged on the component to be connected after the sintering process.

The geometry of the applied paste is preferably selected such that, after the hardening of the paste, a structuring element is obtained that is capable of being equipped with a component, in such a way that a desired region of the surface of the component stands in contact with paste. Here it is possible that only a part of the surface, or the entire surface, of the component with which the structuring element is equipped stands in contact with the structuring element.

The thickness of the applied paste is preferably adapted to the dimensions of the components to be connected. If, for example, a first semiconductor chip is to be connected to a first contact surface of a leadframe situated in a recess, and a second semiconductor chip is to be connected to the second contact surface of a leadframe not situated in a recess, then in order to produce the structuring element by which the first semiconductor chip is to be connected to the first contact surface of the leadframe, a greater application thickness can be selected for the paste than is the case for the production of the structuring element by which the second semiconductor chip is to be connected to the second contact surface of the leadframe. In this way, a structure can be created that has structuring elements having different heights according to the spacing of the components to be connected.

The thickness of application of the paste is not further limited. Customarily, it is in the range of 10-300 µm, preferably in the range of 10-200 µm, and particularly preferably in the range of 20-50 µm.

The paste used according to the present invention is hardened in order to produce the at least one structuring element on the surface of the carrier. In the context of the present invention, the paste is hardened when it has attained a consistency at which the paste does not undergo any change in shape as a result of gravitation.

The hardening of the paste preferably takes place by removing constituents of the paste that are liquid at room temperature, in particular the solvents. In order to remove the constituents that are liquid at room temperature, the paste is preferably dried.

Accordingly, "drying" is understood as the removal of the at least one solvent contained in the paste. The removal of the solvent can take place quantitatively. On the other hand, however, it is also possible for residual amounts of solvent to remain in the paste.

According to a preferred embodiment, during the drying at least 99.5% by weight, more preferably at least 99.7% by weight, and still more preferably at least 99.9% by weight of solvent is removed, relative to the weight of solvent originally present in the paste.

Preferably, the hardened paste contains not more than 0.5% by weight, more preferably not more than 0.4% by weight, still more preferably not more than 0.3% by weight, particularly preferably not more than 0.2% by weight, and most particularly preferably not more than 0.1% by weight of solvent, relative to the weight of the dried paste.

It is particularly preferable for the hardened paste to contain not more than 0.5% by weight, more preferably not more than 0.4% by weight, still more preferably not more than 0.3% by weight, particularly preferably not more than 0.2% by weight, and most particularly preferably not more than 0.1% by weight of compounds that are liquid at a temperature of 25° C. and a pressure of 1013 hPa, relative to the weight of the dried paste.

According to a preferred embodiment, the hardened paste contains 75-95% by weight metal particles, 0.1-15% by weight sintering aids, 0-0.5% by weight solvents, 0-12% by weight metal precursors, and 0-10% by weight additional constituents, relative to the weight of the hardened paste.

According to a particularly preferred embodiment, the hardened paste contains 80-95% by weight metal particles, 2-15% by weight sintering aids, 0-0.3% by weight solvents, 0-12% by weight metal precursors, and 0-10% by weight additional constituents, relative to the weight of the hardened paste.

According to a most particularly preferred embodiment, the hardened paste contains 80-95% by weight metal particles, 3-15% by weight sintering aids, 0-0.1% by weight solvents, 0-12% by weight metal precursors, and 0-10% by weight additional constituents, relative to the weight of the hardened paste.

The hardening of the paste, preferably the drying of the paste, takes place under conditions that ensure that a complete sintering of the paste does not take place. It is accordingly required that the hardened paste have at least a residual reactivity for the sintering process that follows later. However, it can be advantageous to select conditions for the drying under which a partial sintering of the paste already takes place. This can be desirable, for example, in order to increase the stability of the paste as well as the adhesion of the paste to the substrate. The stability of the paste and the adhesion of the paste to the substrate are clearly additionally increased by the at least one organic compound situated on the metal particles as a coating. This is probably due to the fact that, when the temperature is increased, small quantities of the coating compounds detach and act as an adhesion-promoting agent between the metal particles of the paste, or between the metal particles of the paste and the carrier.

Accordingly, the drying of the paste preferably takes place at a temperature, a pressure, and an air humidity level, and for a duration, that are suitable for removing the solvents as completely as possible from the paste, but without its being the case that after the drying the sintering processes have already completely taken place within the paste.

Preferably, the drying takes place at temperatures below 200° C., more preferably below 150° C., and for example at approximately 120° C., for a duration of preferably 3-60 minutes. Standard drying apparatuses can be used for the drying.

During the hardening of the paste, an increase in the porosity of the paste customarily occurs. Surprisingly, it has turned out that the bonding of the structuring elements made of hardened paste to the component to be equipped can take place in a particularly simple manner, if the porosity of the hardened paste is increased. Here, porosity is understood as the portion by volume of pores, relative to the volume of the hardened paste. According to a preferred embodiment, the porosity of the hardened paste is preferably at least 20% by volume, more preferably at least 40% by volume, still more preferably at least 60% by volume, particularly preferably at least 80% by volume, and most particularly preferably at least 90% by volume. The porosity of the hardened paste can easily be set by the portion and the type of the solvent contained in the paste, the drying duration, and the drying temperature.

Further, a foil can be attached on the at least one structuring element containing the hardened paste. This foil can be used in particular to protect the structuring element from damage, for example due to mechanical stress. Preferably, the film covers the entire structure formed from the individual structuring elements on the surface of the carrier of the sintering preform. The film can for example be a film made of polymer or can be a paper. If a film is present on the at least one structuring element, this film is removed during the carrying out of the method according to the present invention. The removal of the film takes place before the at least one structuring element on the surface of the sintering preform containing the hardened paste is contacted with the surface of the first component to be connected.

According to the present invention, at least two components are connected to one another. These each have at least one surface to be connected. A surface of a component to be connected is understood herein as a surface of a component to be connected to the surface of a further component by sintering.

The at least two components to be connected are herein designated as first component or as second component. Here, the terms "first" and "second" are used only to terminologically distinguish the components to be connected. In particular, the use of these terms does not specify anything regarding the type and shape of the components.

For the connecting, the at least one structuring element on the surface of the carrier of the sintering preform is brought into contact with the surface of the first component to be connected. Thus, during the contacting of the at least one structuring element on the surface of the carrier of the sintering preform with the surface of the first component to be connected, an arrangement is created of the first component and the at least one structuring element that stands in contact with the carrier. This arrangement stands in contact with the carrier via the at least one structuring element, wherein an adhesion of the arrangement on the carrier customarily is ensured due to adhesive forces.

Preferably, a plurality of structuring elements are arranged on the surface of the carrier of the sintering preform. In this case, it is preferred that a plurality of structuring elements on the surface of the carrier of the sintering preform, particularly preferably all structuring elements on the surface of the carrier of the sintering preform, be provided with components, including the first component. Preferably, a different component is situated on each structuring element. Accordingly, preferably a plurality of structuring elements on the surface of the carrier of the sintering preform, particularly preferably all structuring elements on the surface of the carrier of the sintering preform, are provided with components independently of one another. These components are preferably disposed next to one another in a plane.

According to a preferred embodiment, the first component is contacted with the at least one structuring element situated on the surface of the carrier of the sintering preform, in such a way that a metallization layer that may be present on the first component stands in contact with the structuring element. If a plurality of components next to one another are brought into contact with a plurality of structuring elements, the contacting preferably also takes place in such a way that metallization layers that may be present on the individual components stand in contact with the structuring elements.

According to a preferred embodiment, the contacting of the at least one structuring element with the surface to be connected of the first component, preferably the contacting of a plurality of structuring elements independently of one another with the surfaces of individual components to be connected, takes place by pressing on. Here, on the one hand the sintering preform having the structuring element can be pressed onto the surface of the first component to be connected, so that the structuring element and the surface of the first component to be connected are connected to one another. On the other hand, the surface of the first component to be connected can also be pressed onto the at least one structuring element of the sintering preform.

This pressing on does not require any special measures. Preferably, the pressing on takes place at temperatures below the sintering temperature, more preferably at temperatures below 200° C., for example at temperatures in the range of 100-200° C. Here it can be preferred to heat the sintering preform provided with at least the first component to the desired press-on temperature. The pressing on can take place under moderate pressure, preferably at a pressure of at least 0.1 $N/mm^2$, more preferably at a pressure of at least 0.5 $N/mm^2$, still more preferably at a pressure of at least 1.0 $N/mm^2$, and particularly preferably a pressure of at least 2 $N/mm^2$. For the pressing on, conventional stamp devices or pressing devices can be used.

The pressing on preferably takes place in such a way that an adhesion is achieved between the at least one structuring element and the first component, which enables easy removal of the arrangement made up of the first component and the at least one structuring element from the carrier of the sintering preform.

After the contacting of the at least one structuring element with the surface of the first component to be connected, an arrangement is thus present that stands in contact with the carrier, preferably adhering to the carrier, and that includes the at least one structuring element and at least the first component, wherein the metallization layer that may be contained on the surface of the first component stands in contact with the structuring element.

Thereafter, the arrangement of the first component and the at least one structuring element is removed from the carrier. For this purpose, on the one hand the carrier, which covers the at least one structuring element now situated on at least the first component, is pulled off from the at least one structuring element of the sintering preform. Preferably, the carrier is then removed from all structuring elements of the sintering preform. On the other hand, the arrangement of the first component and the at least one structuring element can also be lifted off from the carrier. This is possible because the adhesion between the first component and the at least one structuring element is greater than the adhesion between the arrangement and the carrier.

After the removal of the arrangement of the first component and the at least one structuring element from the carrier, the structuring element connected to the first component is available for contacting with the second component. If a plurality of structuring elements were present on the sintering preform, then after the removal of the arrangements from the carrier a plurality of structuring elements provided with components are correspondingly available for contacting with the second component.

Thereafter, according to the present invention the surface to be contacted of the second component is contacted with the at least one structuring element of the arrangement of the first component and the at least one structuring element, in order to create a sintering arrangement made up of the first component, the second component, and the structuring element situated between them.

According to a preferred embodiment, the surface of the second component to be connected is contacted with the at least one structuring element, in such a way that a metallization layer that may be present on the surface of the second component stands in contact with the at least one structuring element. Here, preferably a sintering arrangement is created that includes the first component having a metallization layer, the second component having a metallization layer, and a structuring element situated between them, wherein the metallization layer of the first component and the metallization layer of the second component are connected to one another via the structuring element.

According to a further preferred embodiment, the surface of the second component to be connected can also already have at least one structuring element. This structuring element can, for example, be produced by providing a sintering preform described herein, and contacting the at least one structuring element on the surface of the carrier of the sintering preform with the surface of the second component to be connected, and removing the arrangement of the second component and the structuring element from the carrier of the sintering preform. According to this embodiment, both the first component and the second component already have at least one structuring element. These structuring elements of the first component and of the second component can finally be contacted in order to create a sintering arrangement made up of a first component, a second component, and a structuring element situated between them. In this case, part of the structuring element originates from the contacting of a sintering preform with the first component, and another part of the structuring element originates from the contacting of another sintering preform with the second component. In the following, when the surface of the second component is referred to, this also comprises the case in which the second component already has a structuring element, in accordance with the above-described embodiment. Thus, in the method according to the present invention the surface of the second component to be connected can also be contacted with the at least one structuring element of the arrangement made up of the first component and the at least one structuring element via an additional structuring element, which is part of an arrangement made up of the second component and this structuring element.

The contacting of the surface of the second component to be connected with the at least one structuring element preferably takes place by pressing on. Here, on the one hand the arrangement including the first component and the structuring element is pressed onto the surface of the second component to be connected, so that the first component is connected to the surface of the second component to be connected via the structuring element. On the other hand, the surface of the second component to be connected can also be pressed onto the structuring element connected to the first component.

This pressing on does not require any special measures. Preferably, the pressing on takes place at temperatures below the sintering temperature, more preferably at temperatures below 200° C., thus for example at temperatures in the range of 100-200° C. Here, it can be preferred to heat the arrangement of the first component and the at least one structuring element before the contacting to a temperature in the range of 100-200° C. It can also be preferred to heat the second component before the contacting to a temperature in the range of 100-200° C. It can be particularly preferred to heat both the arrangement of the first component and the at least one structuring element and also the second component before the contacting to a temperature in the range of 100-200° C. The pressing on can take place under moderate pressure, preferably at a pressure of at least 0.1 $N/mm^2$, more preferably at a pressure of at least 0.5 $N/mm^2$, still more preferably at a pressure of at least 1.0 $N/mm^2$, and particularly preferably a pressure of at least 2 N/mm². For the pressing on, conventional stamp devices or pressing devices can be used.

Finally, the sintering arrangement made up of the first component, the second component, and the structuring element situated between them is sintered.

This sintering process is a low-temperature sintering process. According to the present invention, a low-temperature sintering process is to be understood as a sintering process that preferably takes place at a temperature of below 250° C., more preferably at a temperature below 220° C., still more preferably at a temperature below 200° C., and particularly preferably at a temperature below 180° C.

The process pressure during the sintering is preferably below 30 MPa, more preferably below 5 MPa, and still more preferably below 1 MPa. Due to the use of the paste according to the present invention, the sintering can even successfully take place without any application of process pressure, i.e. at a process pressure of 0 MPa.

The sintering time is a function of the process pressure, and preferably lies in a range of 2-45 minutes.

According to the present invention, the sintering process can take place in an atmosphere that is not further limited. However, the sintering is preferably carried out in an atmosphere that contains oxygen.

The sintering is carried out in a conventional device suitable for sintering, in which the above-described process parameters can preferably be set.

The above-described method for connecting at least two components enables a processing of a plurality of components, which is advantageous with regard to process economics and is at least partly parallel, and also enables a structured design of the sintered layer, as well as a lowering of the sintering temperature to below 250° C.

With regard to process economics, the method according to the present invention is advantageous in particular because the connection is created using an already-hardened paste. Thus, according to the present invention no drying of the paste is required immediately before the sintering. In this way, a significant shortening of the process times can be achieved. Further, at the user side no application of the paste is required. This application conventionally takes place using special application devices, during which there is always waste that usually contains noble metals. According to the present invention, the problems of waste disposal or waste treatment, and also of the expensive cleaning of the application devices, no longer arise for the user.

Because according to the present invention the hardening of the paste already takes place before the contacting of the components, during the contacting of the components via the structuring element a very homogenous layer free of cavities is created. In this way, the reliability of the created connection can be significantly improved.

Due to the fact that the individual structuring elements are pre-dimensioned on the carrier of the sintering preform and can be made with different geometries and thicknesses, it is possible to produce connections with contact surfaces of components, even if these contact surfaces do not lie in one plane. In particular, in this way it is also possible to connect to the corresponding components curved leadframes or leadframes having a trough shape.

The possibility of a uniform dimensioning with regard to the thickness, geometry, composition, and volume of the individual structuring elements or of the structure makes it possible to achieve reproducible properties of the contact layer between the components to be connected, enabling the method according to the present invention to be used for applications in which the highest degree of precision is required.

A most essential advantage of the method according to the present invention is that the temperature required for sintering can be significantly reduced through the use of the sintering aids in the hardened pastes.

EXAMPLES

Example 1

By agitation of mixtures having the following compositions, homogenous metal pastes were produced, designated pastes 1-4:

|  | Paste 1 | Paste 2 | Paste 3 | Paste 4 |
| --- | --- | --- | --- | --- |
| Silver | 83 wt. % | 83 wt. % | 83 wt. % | 80 wt. % |
| Aluminum formate | — | — | 5 wt. % | 5 wt. % |
| Silver carbonate | — | — | — | 5 wt. % |
| Terpineol | 17 wt. % | 9 wt. % | 12 wt. % | 10 wt. % |
| Tridecanol | — | 8 wt. % | — | — |

In separate trials, pastes 1-4 were applied onto a polyester film as defined structuring elements having a thickness of 50 μm, and were thereafter dried at a temperature of 100° C. for a time period of 10 minutes, in order to obtain sintering preforms 1-4, each containing a carrier (polyester foil) having structuring elements made of hardened paste 1-4.

Thereafter, chips having a nickel-silver metallization and a surface of 25 mm² were placed, with a pressure of 2 MPa, onto the structuring elements of the individual sintering preforms 1-4. Here, arrangements of chip and structuring element were obtained that stood in contact with the carrier. Thereafter, the arrangements of chip and structuring element were lifted off from the carrier and were placed onto the nickel-gold metallization of a DCB (direct copper bonded) substrate. This sandwich arrangement of DCB substrate, chip, and structuring element situated between them, was thereafter sintered between two heating plates at a temperature of 200° C. and a pressure of 10 MPa for a time period of 2 minutes.

Result of Example 1:

The shear strengths of the contact layers obtained in Example 1 between the DCB substrate and the chip were determined using a conventional shear test.

The results of the shear test are summarized in the following table:

| Sintering preform | 1 | 2 | 3 | 4 |
| --- | --- | --- | --- | --- |
| Shear strength | Very low | Very low | High | Very high |
| Remarks | Practically no connection possible between chip and substrate | Practically no connection possible between chip and substrate; shear strength however somewhat higher than in #1 | Stable connection between chip and substrate; shear strength significantly higher than in #1 and #2 | Very stable connection between chip and substrate; shear strength significantly higher than in #1 and #2; shear strength somewhat higher than in #3 |

It turned out that the addition of aluminum formate resulted in a significant increase in the shear strength of the contact layers between chip and substrate obtained using the sintered performs. An even more stable connection was achieved through the joint addition of aluminum formate and silver carbonate.

Example 2

By agitation of mixtures having the following compositions, homogenous metal pastes were produced that were designated pastes 5 and 6:

|  | Paste 5 | Paste 6 |
|---|---|---|
| Silver | 80 wt. % | 80 wt. % |
| Dicumyl peroxide | — | 5 wt. % |
| Silver carbonate | 5 wt. % | 5 wt. % |
| Terpineol | 15 wt. % | 10 wt. % |

Pastes 5 and 6 were used to produce sintering preforms (sintering preforms 5 and 6) that were in turn used to fasten a chip to a substrate. Here the procedure was analogous to that in Example 1, but a chip was used having a surface of 100 mm$^2$.

Result of Example 2:

The shear strengths of the contact layers obtained in Example 2 between the DCB substrate and the chip were determined using a conventional shear test.

It turned out that the contact layer produced using sintering preform 6 had a significantly higher shear strength than did the contact layer obtained using sintering preform 5. Accordingly, here as well the addition of the sintering aid according to the present invention had a positive effect on the stability of the produced contact layer between the chip and the substrate.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A sintering preform comprising a carrier having a surface, the surface having at least one structuring element containing hardened paste, wherein the hardened paste consists essentially of:
   (a) metal particles having a coating that contains at least one organic compound;
   (b) at least one sintering aid selected from the group consisting of (b1) organic peroxides, (b2) inorganic peroxides, (b3) inorganic acids, (b4) salts of organic acids, wherein the organic acids have 1-4 carbon atoms, (b5) esters of organic acids, wherein the organic acids have 1-4 carbon atoms, and (b6) carbonyl complexes, and
   (c) optionally at least one metal precursor;
   and wherein the surface of the carrier having the hardened paste is not reactive to the constituents of the paste.

2. The sintering preform according to claim 1, wherein the metal particles are silver particles.

3. The sintering preform according to claim 1, wherein the at least one organic compound of the coating is selected from the group consisting of fatty acids, fatty acid salts, and fatty acid esters.

4. The sintering preform according to claim 1, wherein a molar ratio of sintering aids to the organic compounds contained in the coating lies in a range of 1:1 to 150:1.

5. The sintering preform according to claim 1, wherein the at least one sintering aid comprises an organic peroxide selected from the group consisting of diisobutyryl peroxide, cumene peroxyneodecanoate, 1,1,3,3-tetramethylbutyl peroxyneodecanoate, di-n-propyl peroxydicarbonate, tert-amyl-peroxyneodecanoate, di-(2-ethylhexyl)-peroxydicarbonate, tert-butyl peroxyneodecanoate, di-n-butyl peroxydicarbonate, 1,1,3,3-tetramethylbutyl peroxypivalate, tert-butyl peroxyneoheptanoate, tert-amyl peroxypivalate, tert-butyl peroxypivalate, di-(3,5,5-trimethylhexanoyl) peroxide, tert-butyl peroxy-2-ethylhexanoate, tert-butyl peroxyisobutyrate, 1,1-di-(tert-butylperoxy)-3,3,5-trimethylcyclohexane, 1,1-di-(tert-butylperoxy)-cyclohexane, tert-butyl-peroxy-3,5,5-trimethylhexanoate, 2,2-di-(tert-butylperoxy)-butane, tert-butylperoxyisopropylcarbonate, tert-butyl peroxyacetate, 2,5-dimethyl-2,5-di(2-ethylhexanoylperoxy)-hexane, 1,1,3,3-tetramethylbutyl-peroxy-2-ethylhexanoate, tert-amyl-peroxy-2-ethylhexanoate, tert-butyl peroxydiethylacetate, tert-amyl-peroxy-2-ethylhexylcarbonate, tert-butyl-peroxy-2-ethylhexylcarbonate,tert-butyl peroxybenzoate, di-tert amylperoxide, 2,5-dimethyl-2,5-di-(tert-butylperoxy)-hexane, tert-butylcumyl peroxide, 2,5-dimethyl-2,5-di(tert-butylperoxy)hexyne-3, di-tert-butyl peroxide, 3,6,9-triethyl-3,6,9-trimethyl-1,4,7-triperoxonane, di-isopropylbenzene monohydroperoxide, p-menthane hydroperoxide, cumene hydroperoxide, dicumyl peroxide, and 1,1,3,3- tetramethylbutyl hydroperoxide.

6. The sintering preform according to claim 1, wherein the at least one sintering aid comprises an inorganic peroxide selected from the group consisting of hydrogen peroxide, ammonium peroxide, lithium peroxide, sodium peroxide, potassium peroxide, magnesium peroxide, calcium peroxide, barium peroxide, and peroxoborates.

7. The sintering preform according to claim 1, wherein the at least one sintering aid comprises an inorganic acid comprising a phosphoric acid.

8. The sintering preform according to claim 1, wherein the at least one sintering aid comprises a salt of an organic acid selected from the group consisting of acetates, carbonates, formates, lactates, and oxalates.

9. The sintering preform according to claim 1, wherein the at least one sintering aid comprises a salt of an organic acid selected from the group consisting of magnesium formate, aluminum formate, iron(II) formate, tin(II) formate, copper (II) formate, silver(II) formate, and manganese(III) formate.

10. The sintering preform according to claim 1, wherein the at least one sintering aid comprises a salt of an organic acid selected from the group consisting of copper(II) lactate and silver(I) lactate.

11. The sintering preform according to claim 1, wherein the at least one sintering aid comprises an ester of an organic acid selected from the group consisting of methyl formate, ethyl formate, propyl formate, and butyl formate.

12. The sintering preform according to claim 1, wherein the at least one sintering aid comprises a carbonyl complex selected from the group consisting of metal carbonyls.

13. The sintering preform according to claim 1, wherein a foil is applied on the at least one structuring element that contains the hardened paste.

* * * * *